(12) United States Patent
Sumida et al.

(10) Patent No.: US 8,754,332 B2
(45) Date of Patent: Jun. 17, 2014

(54) DISPLAY DEVICE

(75) Inventors: Yukihiro Sumida, Osaka (JP); Takeshi Muraoka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 358 days.

(21) Appl. No.: 13/058,268

(22) PCT Filed: Aug. 3, 2009

(86) PCT No.: PCT/JP2009/063726
§ 371 (c)(1),
(2), (4) Date: Feb. 9, 2011

(87) PCT Pub. No.: WO2010/018759
PCT Pub. Date: Feb. 18, 2010

(65) Prior Publication Data
US 2011/0139493 A1 Jun. 16, 2011

(30) Foreign Application Priority Data
Aug. 11, 2008 (JP) .................. 2008-207186

(51) Int. Cl.
*H05K 1/00* (2006.01)

(52) U.S. Cl.
USPC .......... 174/254; 174/255; 174/260; 174/261; 174/262; 361/749; 361/803; 345/92; 345/156; 345/204; 345/206; 349/58; 349/138; 349/149; 349/150; 349/152; 349/187; 257/359; 257/678; 257/690; 347/50; 347/209; 439/721; 439/876

(58) Field of Classification Search
USPC .......... 174/254, 255, 260–262; 361/749, 803; 345/92, 156, 204, 206; 349/58, 138, 349/149, 150, 152, 187, 245; 257/690; 347/50, 209; 439/721, 876
See application file for complete search history.

(56) References Cited

U.S. PATENT DOCUMENTS

| | | | | | |
|---|---|---|---|---|---|
| 5,166,700 | A | * | 11/1992 | Ota | 347/209 |
| 5,309,316 | A | * | 5/1994 | Yagi et al. | 361/749 |
| 5,592,199 | A | * | 1/1997 | Kawaguchi et al. | 345/206 |
| 5,670,994 | A | * | 9/1997 | Kawaguchi et al. | 345/206 |
| 5,914,763 | A | * | 6/1999 | Fujii et al. | 349/149 |

(Continued)

FOREIGN PATENT DOCUMENTS

| | | |
|---|---|---|
| JP | 09-218420 | 8/1997 |
| JP | 2002-344097 | 11/2002 |

(Continued)

OTHER PUBLICATIONS

International Search Report for PCT/JP2009/063726, mailed Aug. 25, 2009.

*Primary Examiner* — Xiaoliang Chen
(74) *Attorney, Agent, or Firm* — Nixon & Vanderhye P.C.

(57) ABSTRACT

Provided is a flexible substrate wherein a connection portion between the flexible substrate and an electric circuit board meets requirements of narrow wiring pitch and low resistance at the connection portion. An electric circuit structure, which has the flexible substrate and the electric circuit board to which the flexible substrate is connected, is also provided. A wiring pattern (22) is formed on a flexible base film (21), a connection terminal (25) connected electrically to an electrode terminal of another electric circuit board is arranged at an end portion of the wiring pattern (22), and the connection terminal (25) includes wide connection terminals (25*b*, 25*c*) having a terminal width extending across plural lines of the wiring pattern (22).

8 Claims, 4 Drawing Sheets

(56) References Cited

U.S. PATENT DOCUMENTS

| | | | |
|---|---|---|---|
| 6,184,966 B1* | 2/2001 | Fujita et al. | 349/152 |
| 6,323,931 B1* | 11/2001 | Fujita et al. | 349/152 |
| 6,411,359 B1* | 6/2002 | Kobayashi et al. | 349/149 |
| 6,619,785 B1* | 9/2003 | Sato | 347/50 |
| 6,683,662 B2* | 1/2004 | Fujita et al. | 349/43 |
| 7,965,366 B2* | 6/2011 | Shie | 349/150 |
| 8,169,427 B2* | 5/2012 | Sato et al. | 345/204 |
| 8,228,677 B2* | 7/2012 | Kunimatsu et al. | 361/749 |
| 2002/0012096 A1* | 1/2002 | Uchiyama | 349/187 |
| 2002/0044329 A1* | 4/2002 | Shoji | 359/245 |
| 2002/0053667 A1* | 5/2002 | Fujita et al. | 257/59 |
| 2003/0015349 A1* | 1/2003 | Watanabe | 174/261 |
| 2003/0058398 A1* | 3/2003 | Yano | 349/149 |
| 2003/0102424 A1* | 6/2003 | Izumi et al. | 250/208.1 |
| 2004/0159930 A1* | 8/2004 | Makita et al. | 257/690 |
| 2005/0052442 A1* | 3/2005 | Takenaka et al. | 345/204 |
| 2005/0176310 A1* | 8/2005 | Kataoka et al. | 439/876 |
| 2005/0201670 A1* | 9/2005 | Uchiyama | 385/14 |
| 2005/0259069 A1* | 11/2005 | Baker et al. | 345/156 |
| 2006/0065437 A1* | 3/2006 | Yumoto et al. | 174/260 |
| 2006/0176069 A1* | 8/2006 | Takayoshi et al. | 324/765 |
| 2006/0244741 A1* | 11/2006 | Kimura et al. | 345/204 |
| 2007/0138613 A1* | 6/2007 | Matsumoto et al. | 257/678 |
| 2007/0273045 A1* | 11/2007 | Kitada et al. | 257/782 |
| 2008/0050982 A1* | 2/2008 | Kaneko | 439/721 |
| 2008/0084530 A1* | 4/2008 | Hirabayashi et al. | 349/150 |
| 2008/0088784 A1* | 4/2008 | Nakayama et al. | 349/138 |
| 2008/0117376 A1* | 5/2008 | Takenaka | 349/152 |
| 2008/0179085 A1 | 7/2008 | Choi et al. | |
| 2008/0218459 A1* | 9/2008 | Kim et al. | 345/87 |
| 2009/0033609 A1* | 2/2009 | Ashizawa et al. | 345/92 |
| 2009/0039495 A1* | 2/2009 | Yamashita et al. | 257/690 |
| 2009/0153765 A1* | 6/2009 | Yamashita et al. | 349/58 |
| 2010/0182530 A1* | 7/2010 | Fujikawa | 349/58 |

FOREIGN PATENT DOCUMENTS

| | | |
|---|---|---|
| JP | 2006-030630 | 2/2006 |
| JP | 2006-119321 | 5/2006 |
| KR | 2008-0070420 | 7/2008 |
| RU | 2138930 | 9/1999 |
| WO | WO 93/16574 | 8/1993 |

* cited by examiner

DISPLAY DEVICE

This application is the U.S. national phase of International Application No. PCT/JP2009/063726, filed 3 Aug. 2009, which designated the U.S. and claims priority to Japanese Patent Application No. 2008-207186, filed 11 Aug. 2008, the entire contents of each of which are hereby incorporated by reference.

TECHNICAL FIELD

The present invention relates to a flexible substrate whose connection terminals provided at an end portion of a wiring pattern are connected to electrode terminals of an electric circuit board by an anisotropic conductive film, and an electric circuit structure having the flexible substrate and an electric circuit board to which the flexible substrate is connected. The present invention particularly relates to a flexible substrate and an electric circuit structure that allow a favorable electrical connection between the connection terminals of the flexible substrate and the electrode terminals of the electric circuit board.

BACKGROUND ART

A matrix substrate constituting a flat image display element such as a liquid crystal panel is an electric circuit board in which various electric circuit elements, such as a pixel electrode constituting a unit of image display, a switching element for applying a predetermined electric charge to the pixel electrode and a metal line are formed on the inner surface.

In the vicinity of an end portion of the matrix substrate constituting the liquid crystal panel, electrode terminals are provided at tips of lead-out lines that are led out from the metal lines formed in a display region where images are displayed, and a flexible substrate (FPC: Flexible Printed Circuit) is connected to these electrode terminals. Thus, various signals for displaying images and a power supply voltage for activating the matrix substrate as the electric circuit board are supplied from peripheral circuit boards other than the liquid crystal panel 10.

The lead-out lines formed on the matrix substrate include a power supply line for supplying a power supply potential for activating the electric circuit elements formed on the matrix substrate and a ground line for connecting ground potentials in an electric circuit formed on the substrate. Since the large amount of current flows through the power supply line and the ground line, it is necessary to reduce electrical resistance values of these lines. Because of this, the power supply line and the ground line generally are formed wider than other signal lines, and not all the lead-out lines have the same line width. On the other hand, the electrode terminals formed on the matrix substrate are formed to have the same line width and the same pitch.

The matrix substrate and the flexible substrate are connected as follows: an anisotropic conductive film (ACF) in which conductive microparticles are mixed in an adhesive resin base material is attached to an connection portion of either of the matrix substrate and the flexible substrate; connection terminals and their corresponding electrode terminals are aligned to overlap with each other; and the overlapped substrates are pressed with a predetermined pressure. Thus, the conductive particles in the anisotropic conductive film connect the connection terminals of the flexible substrate and the electrode terminals of the matrix substrate electrically, and the adhesive resin that is the base material joints the flexible substrate and the matrix substrate physically, thereby connecting both the substrates electrically and physically at the same time.

FIG. 7 is a partial enlarged plan view showing the connection portion between the matrix substrate 2 of the liquid crystal panel and a flexible substrate 50 in the conventional liquid crystal display device. Note here that, for the sake of simplicity, an illustration of the anisotropic conductive film connecting the flexible substrate 50 and the matrix substrate 2 is omitted.

As described above, the electrode terminals 6 formed on the matrix substrate 2 have the same line width and the same pitch. On the other hand, the lead-out lines 4 (4a, 4b, 4c) have different line widths depending on the application. For example, as for the electrode terminal 6 of a narrow lead-out line 4a used as a signal line for example, one electrode terminal 6 is connected to one lead-out line 4a. As for the electrode terminal 6 of a slightly wide lead-out line 4b used as a power supply line for example, two electrode terminals 6 are connected to one lead-out line 4b. As for the electrode terminal 6 of an even wider lead-out line 4c used as a ground line for example, three electrode terminals 6 are connected to one lead-out line 4c.

In the conventional flexible substrate 50 connected to the matrix substrate 2, an end portion of a wiring pattern 52 formed on a base film 51 is an exposed region 54 from which a protection layer 53 formed on the surface is removed. A portion of the wiring pattern 52 exposed in the exposed region 54 is a connection terminal 55. Note here that since the flexible substrate 50 is connected to the matrix substrate 2 in such a manner that the exposed connection terminals 55, from which the protection layer 53 has been removed, are opposed to the electrode terminals 6, the base film 51 of the flexible substrate 50 is positioned on a most frontward side, the protection layer 53 is positioned on a most backward side, and the wiring pattern 52 is positioned between the base film 51 and the protection layer 53. Further, the connection terminals 55 are formed to have the same pitch as the electrode terminals 6 to be connected, the connection terminals 55 of the conventional flexible substrate 50 have the same line width and the same pitch.

Note here that, in order to absorb an alignment error between the electrode terminals 6 and the connection terminals 55 during the connection operation of the matrix substrate 2 and the flexible substrate 50, generally, as shown in FIG. 7, the connection terminals 55 of the flexible substrate 50 made of low-resistant metal foils are designed to be narrower than the electrode terminals 6 formed as metal films on the matrix substrate 2.

SUMMARY OF INVENTION

Problem to be Solved by the Invention

However, as shown in FIG. 7, since all the connection terminals 55 of the conventional flexible substrate 50 have the same width regardless of the thickness of the lead-out lines 4 (4a, 4b, 4c) connected to the electrode terminals 6 of the matrix substrate 2 to be connected, the probability of the conductive particles of the anisotropic conductive film coming into contact with the connection terminals 55 is the same in all the connection terminals 55 to be connected to the electrode terminal 6.

Such a conventional flexible substrate cannot fully meet requirements of narrow wiring pitch at the connection portion between the flexible substrate and the matrix substrate and low resistance for realizing a high-speed signal transfer, which are required for liquid crystal display devices in accordance with the rapidly growing demand with respect to the high resolution and dynamic image display of the display element.

With the foregoing in mind, it is an object of the present invention to provide a flexible substrate capable of corresponding to the requirements of narrow wiring pitch and lower resistance at the connection portion between the flexible substrate and the matrix substrate, and an electric circuit structure having the flexible substrate and an electric circuit board to which the flexible substrate is connected.

Means for Solving Problem

In order to solve the foregoing problem, a flexible substrate according to the present invention is formed with a wiring pattern on a flexible base film, wherein an end portion of the wiring pattern has a connection terminal to be connected electrically to an electrode terminal of another electric circuit board, and the connection terminal includes a wide connection terminal having a terminal width extending across plural lines of the wiring pattern.

Further, an electric circuit structure according to the present invention includes: the flexible substrate according to the present invention; and an electric circuit board in which an electric circuit element and an electrode terminal that is connected to the electric circuit element by a lead-out line are formed on a surface of the board, wherein the flexible substrate and the electric circuit board are connected with each other by an anisotropic conductive film, and the wide connection terminal is connected to a plurality of the electrode terminals that are connected to one lead-out line on the electric circuit board.

Effects of the Invention

According to the present invention, by adopting a wide connection terminal having a terminal width extending across plural lines of the wiring pattern as the connection terminal of the flexible substrate, it is possible to obtain a flexible substrate capable of reducing contact resistance at a connection portion with an electric circuit board, and an electric circuit structure having the flexible substrate and an electric circuit board to which the flexible substrate is connected.

BRIEF DESCRIPTION OF DRAWINGS

FIG. 5 shows a configuration of another flexible substrate according to the embodiment of the present invention.

DESCRIPTION OF EMBODIMENT

Figure 1:
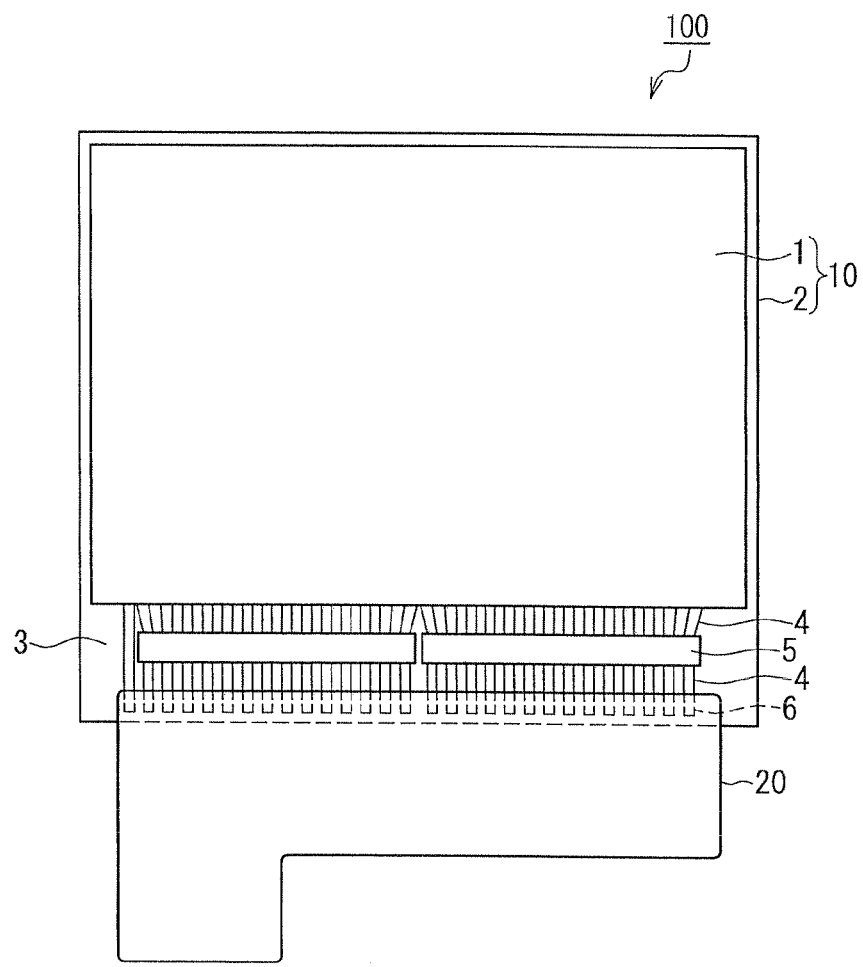
FIG. 1 shows a schematic configuration of a liquid crystal display device according to an embodiment of the present invention.

A flexible substrate according to the present invention is formed with a wiring pattern on a flexible base film, wherein an end portion of the wiring pattern has a connection terminal to be connected electrically to an electrode terminal of another electric circuit board, and the connection terminal includes a wide connection terminal having a terminal width extending across plural lines of the wiring pattern.

With the configuration described above, since the connection terminal of the flexible substrate includes the wide connection terminal having the terminal width extending across plural lines of the wiring pattern, resistance at the connection portion of the flexible substrate can be reduced. Because of this, in an opposed portion between the connection terminal and the electrode terminal connected to the connection terminal, it is possible to increase a ratio of a surface area of the connection terminal to a surface area of the electrode terminal. Therefore, in the case where the resistance at the connection portion is reduced on the electric circuit board to be connected, the connection terminal of the flexible substrate can correspond to this, thereby realizing low resistance at the connection portion between the flexible substrate and the electric circuit board.

In the flexible substrate of the above-described configuration, preferably, the wide connection terminal has an opening at a position corresponding to between lines of the wiring pattern. With this configuration, the joint between the base film of the flexible substrate and the main body of the electric circuit board, other than at the portion formed with the electrodes, can be strengthened further while keeping the ratio of the surface area of the connection terminal to the surface area of the electrode terminal.

Further, preferably, the opening is an identification mark. Thus, the opening can be used effectively.

Further, an electric circuit structure according to the present invention includes: the flexible substrate according to the present invention; and an electric circuit board in which an electric circuit element and an electrode terminal that is connected to the electric circuit element by a lead-out line are formed on a surface of the board, wherein the flexible substrate and the electric circuit board are connected with each other by an anisotropic conductive film, and the wide connection terminal is connected to a plurality of the electrode terminals that are connected to one lead-out line on the electric circuit board.

With this configuration, when a plurality of the electrode terminal are connected to one lead-out line on the electric circuit board, i.e., when the resistance at the connection portion is reduced on the electric circuit board, it is possible to realize an electric circuit structure capable of reducing contact resistance at the connection portion between the flexible substrate and the electric circuit board correspondingly.

Further, preferably, the electric circuit structure is a liquid crystal display device, and the electric circuit board is at least one of a pair of substrates opposed to each other with a liquid crystal layer interposed therebetween in the liquid crystal display device.

Hereinafter, an embodiment of the present invention will be described with reference to the drawings.

Note here that, in the description of the embodiment of the present invention, a configuration example of a flexible substrate according to the present invention is illustrated in the case where the flexible substrate is connected to a matrix substrate of a liquid crystal panel so as to form a liquid crystal display device. In addition, an electric circuit structure of the present invention is described in the case where an electric circuit board to which the flexible substrate is connected is a matrix substrate constituting a liquid crystal panel.

However, the following description does not limit the uses of the flexible substrate and the electric circuit structure of the present invention. The electric circuit board to which the flexible substrate of the present invention is connected is not limited to the matrix substrate of the liquid crystal panel, and examples thereof include a matrix substrate of an image display device in which a display element other than a liquid crystal panel is used, and an electric circuit board applied widely to, for example, an acoustic device and an information processor. Similarly, the electric circuit structure of the present invention is not limited to the liquid crystal display device, and is widely applicable to various flat display devices, such as organic/inorganic EL displays, a field emission cold cathode display device and a plasma display panel (PDP). Further, the electric circuit structure of the present invention is applicable not only to the display devices but also to various modules in which a flexible substrate is connected to an electric circuit board, such as drive circuits of an acoustic device and an information processor.

Note here that, for convenience of explanation, the drawings referred to herein are simplified drawings showing exclusively principal members necessary for explaining the present invention, among constituent members of the embodiment of the present invention. A display device according to the present invention therefore possibly includes arbitrary constitutional members not shown in the drawings referred to in the present specification. Besides, dimensions of the members shown in the drawings do not faithfully represent the actual dimensions of the constitutional members and the actual dimension ratios of the members.

FIG. 1 is a schematic configuration of a liquid crystal display device 100, showing an exemplary electric circuit structure of the present invention.

As shown in FIG. 1, in the liquid crystal display device 100 of the present embodiment, a glass counter substrate 1 and a glass matrix substrate 2 on which an electric circuit element is formed sandwich a liquid crystal layer (not shown), whereby a liquid crystal panel 10 is formed. In an inner surface of the counter substrate 1, color filters corresponding to respective pixels are formed for displaying color images, and counter electrodes are provided for applying a predetermined voltage to the liquid crystal layer. Further, in an inner surface of the matrix substrate 2, pixel electrodes are arranged in matrix having a plurality of rows and a plurality of columns. By adjusting the electric potential between the pixel electrodes and the counter electrodes, an orientational state of the liquid crystal layer changes, whereby images are displayed. Therefore, a region where the pixel electrodes of the matrix substrate 2 are formed is a display region of the liquid crystal panel 10.

In the display region, there are a plurality of gate lines arranged in a row direction of the pixel electrodes, a plurality of source lines arranged in a column direction thereof, and TFTs connected to the respective pixel electrodes and arranged near intersections of the gate lines and the source lines that are orthogonal to each other. Note here that illustrations of internal structures of the counter substrate 1 and the matrix substrate 2 are omitted.

Further, on both outer surfaces of the counter substrate 1 and the matrix substrate 2 constituting the liquid crystal panel 10, a pair of polarizing plates, each having a different predetermined polarizing angle, are arranged for displaying images in combination with the liquid crystal layer of the liquid crystal panel 10 by the control of the transmitted light. An illustration of the polarizing plates is omitted in FIG. 1.

The matrix substrate 2 has a slightly larger surface area than the counter substrate 1 and includes a surface-exposed wiring region 3 in a lower part of the liquid crystal panel 10, as shown in FIG. 1. In the wiring region 3, lead-out lines 4 that are led out from the gate lines and the source lines formed in the display region are provided. In the liquid crystal panel 10 of the present embodiment, a COG (Chip On Glass) technology is adopted in which a driving semiconductor 5 for processing signals to display images is provided on the lead-out lines 4. Tip ends of the lead-out lines 4 that are connected to the driving semiconductor 5 on the side near an end portion of the matrix substrate 2 are electrode terminals 6 to which a flexible substrate 20 is connected.

The flexible substrate 20 is connected to a peripheral circuit board (not shown) on a side opposite to a connection portion with the matrix substrate 2. Signals from the peripheral circuit board and power supply potentials for activating the electric circuit element on the matrix substrate 2 are applied to the matrix substrate 2 via the flexible substrate 20.

In the liquid crystal display device 100 of the present embodiment, the matrix substrate 2 and the flexible substrate 20 are connected by an anisotropic conductive film (ACF) in the following manner: an anisotropic conductive film is attached to the electrode terminal 6 portion of the matrix substrate 2 or a connection terminal portion (not shown in FIG. 1) of the flexible substrate 20; connection terminals and their corresponding electrode terminals 6 are aligned to overlap with each other accurately; and the overlapped substrates are pressed with a predetermined pressure. Thus, conductive particles contained in the anisotropic conductive film connect the connection terminals of the flexible substrate 20 and the electrode terminals 6 of the matrix substrate 2 electrically; besides, adhesive resin that is a base material of the anisotropic conductive film joints the flexible substrate 20 and the matrix substrate 2 physically. Thus, it is possible to connect the matrix substrate 2 and the flexible substrate 20 electrically and physically at the same time.

Note here that, in the flexible substrate 20 used for the liquid crystal display device 100 of the present embodiment, it also is possible to adopt a TCP (Tape Carrier Package) technology in which circuit elements such as a semiconductor chip for driving and a capacitor are mounted on the flexible substrate 20.

When the liquid crystal panel 10 is a so-called transmissive panel or semi-transmissive panel, a backlight irradiating irradiation light that is necessary for displaying images on the liquid crystal panel 10 is disposed on a back face of the liquid crystal panel 10. The liquid crystal panel 10 and the backlight are housed inside a bezel that is a bottomed and frame-shaped mechanism member, whereby a liquid crystal module as the liquid crystal display device 100 is formed. Illustrations of the backlight and the bezel are omitted in FIG. 1.

Further, in FIG. 1, the flexible substrate 20 that is connected to the matrix substrate 2 is illustrated in a state of being expanded in a transverse direction, but in order to reduce the outer dimension of the liquid crystal module, the flexible substrate 20 may be fold along a side surface of the bezel (not shown) and the other end thereof is fixed to a back face side of the bezel.

Further, in FIG. 1, an example is shown in which the wiring region 3 that is connected to the flexible substrate 20 is provided only in the lower part of the liquid crystal panel 10 of the matrix substrate 2, but the liquid crystal display device 100 which is the electric circuit structure of the present invention is not limited hereto. For example, both right and left sides of the matrix substrate 2 may be formed larger than the counter substrate 1 so that the wiring regions 3 are formed on the both sides of the matrix substrate 2 and the flexible substrates 20 are connected to the wiring regions 3. Further, the example of FIG. 1 does not limit the number of the flexible substrates 20 to be connected to the wiring region 3.

Figure 2:
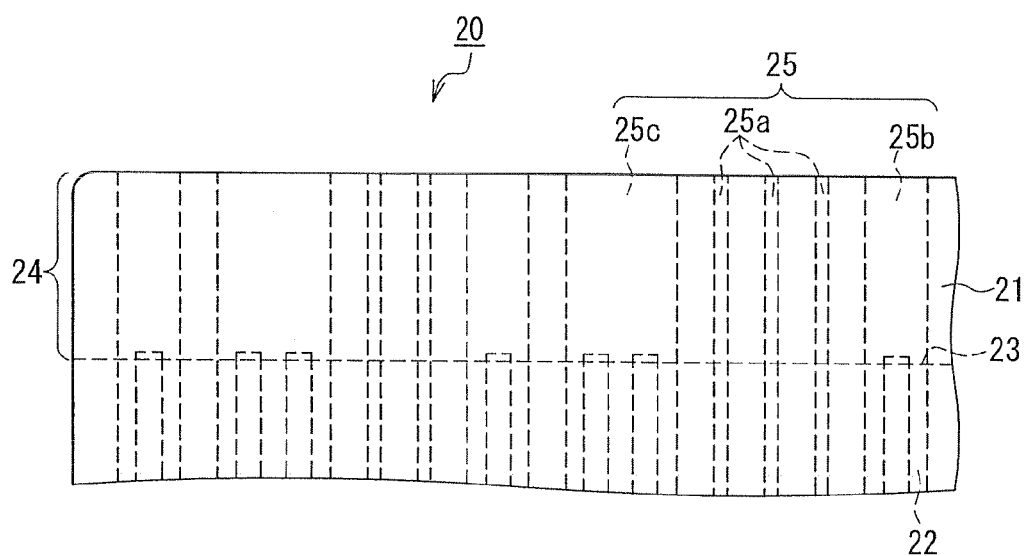
FIG. 2 is a partial enlarged plan view showing a configuration of a flexible substrate according to the embodiment of the present invention.

FIG. 2 is a partial enlarged plan view showing an end portion of the flexible substrate 20, which is used for the liquid crystal display device 100 of the present embodiment, on the side connected to the matrix substrate 2.

In the flexible substrate 20 shown in FIG. 2, a predetermined wiring pattern 22 is formed using a metal foil such as a copper foil about 10 to 50 μm in thickness on a flexible-insulative base film 21 such as polyimide about 10 to 50 μm in thickness via an adhesive layer (not shown), and a surface of the wiring pattern 22 is covered with an insulative protection layer 23. That is, the flexible substrate 20 is composed of three layers that are the base film 21, the wiring pattern 22 and the protection layer 23. Note here that, in FIG. 2, since the flexible substrate 20 is seen from the base film 21 side, the base film 21 is positioned on a most frontward side of this drawing, the protection layer 23 is positioned on a most backward side, and the wiring pattern 22 is positioned between the base film 21 and the protection layer 23.

An end portion of the flexible substrate 20 on the side connected to the matrix substrate 2 is an exposed region 24 from which the protection layer 23 is removed. A portion of the wiring pattern 22 exposed in the exposed region 24 is a connection terminal 25 (25a, 25b, 25c).

As shown in FIG. 2, the connection terminal 25 (25a, 25b, 25c) of the flexible substrate 20 of the present embodiment includes a connection terminal 25a formed as a terminal having the same width as a wiring width of the wiring pattern 22, and wide connection terminals 25b and 25c formed wider so as to have a width extending across plural lines.

Figure 3:
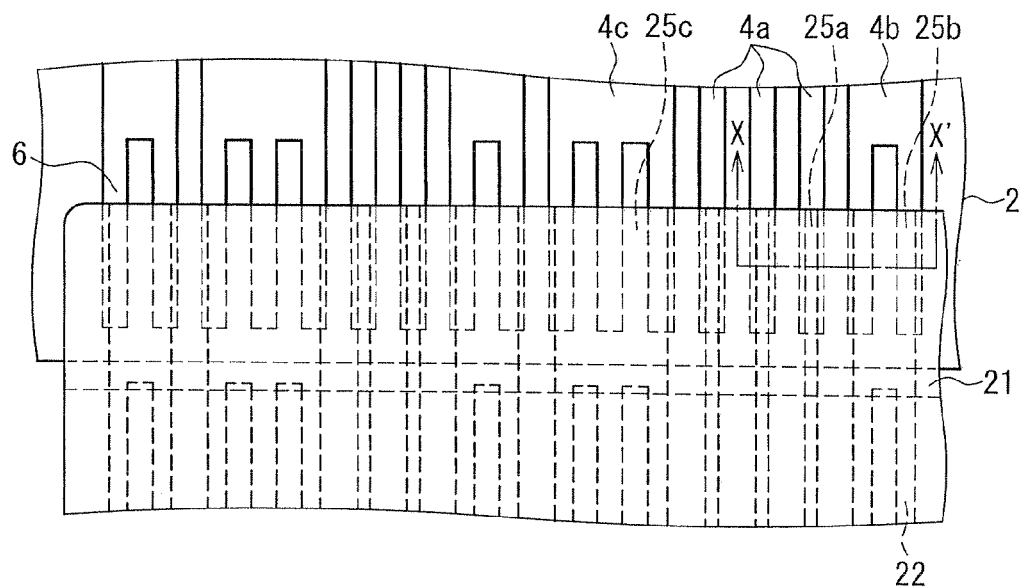
FIG. 3 is a partial enlarged plan view showing a connection portion between the flexible substrate according to the embodiment of the present invention and a matrix substrate of a liquid crystal panel.

Next, with reference to FIG. 3, the relationship between the wiring width of the connection terminal 25 of the flexible substrate 20 according to the present embodiment and the electrode terminal 6 of the matrix substrate 2 to which the flexible substrate 20 is connected is described based on the relationship between the electrode terminal 6 and the lead-out line 4 (4a, 4b, 4c) on the matrix substrate 2.

Figure 7:
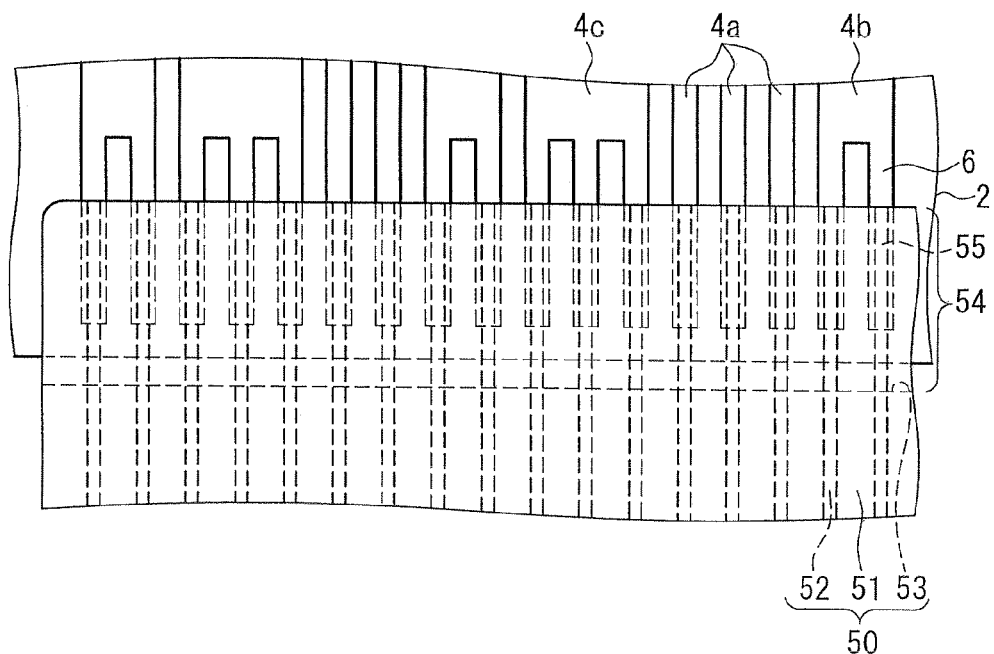
FIG. 7 is a partial enlarged plan view showing a connection portion between a flexible substrate and a matrix substrate of a liquid crystal panel of a conventional liquid crystal display device.

FIG. 3 is a partial enlarged plan view showing the connection portion between the flexible substrate 20 and the matrix substrate 2 of the liquid crystal panel 10. Note here that, in order to show differences between the flexible substrate 20 of the present embodiment and a conventional flexible substrate 50 more clearly, shapes of the electrode terminal 6 and the lead-out line 4 formed on the matrix substrate 2 in FIG. 3 are identical to those in FIG. 7. Further, in FIG. 3, an illustration of the anisotropic conductive film used for connecting the flexible substrate 20 and the matrix substrate 2 is omitted as in FIG. 7.

As shown in FIG. 3, the width of the connection terminal 25 of the flexible substrate 20 according to the present embodiment varies depending on how the electrode terminal 6 to which the connection terminal 25 is connected is connected to the lead-out line 4 (4a, 4b, 4c) on the matrix substrate 2.

On the matrix substrate 2, as for the electrode terminal 6 of the narrow lead-out line 4a used as a signal line or the like, one electrode terminal 6 is connected to one lead-out line 4a. Such a connection terminal 25a on the flexible substrate 20 to be connected to the electrode terminal 6, which is connected to the lead-out line 4a one by one, has the same width as the wiring pattern 22.

On the other hand, as for the slightly wide lead-out line 4b used as a power supply line for example, two electrode terminals 6 are connected to one lead-out line 4b. As for the even wider lead-out line 4c used as a ground line for example, three electrode terminals 6 are connected to one lead-out line 4c. As described above, when a plurality of electrode terminals 6 are connected to one lead-out line 4b and 4c, the connection terminals 25b and 25c to be connected to the electrode terminals 6 are wider than the connection terminal 25a having the same width as the wiring pattern 22 and have the width extending across plural lines, which are referred to as the wide connection terminals 25b and 25c.

Specifically, the connection terminal 25b to be connected to two electrode terminals 6 that are connected to the lead-out line 4b corresponds to each of the two electrode terminals 6 and has the wiring width extending across two lines on the flexible substrate, which is referred to as the wide connection terminal 25b. Further, the connection terminal 25c to be connected to three electrode terminals 6 that are connected to the lead-out line 4c corresponds to each of the three electrode terminals 6 and has the wiring width extending across three lines, which is referred to as the wide connection terminal 25c.

An effect obtained by setting the connection terminal 25 of the flexible substrate 20 to have the width extending across plural lines so as to correspond to a plurality of electrode terminals 6 connected to one lead-out line 4 on the matrix substrate 2 is described with reference to FIG. 4.

Figure 4:
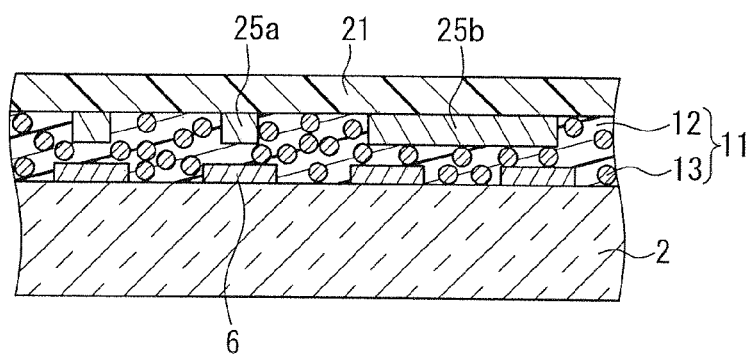
FIG. 4 is a cross-sectional configuration view showing the connection portion between the flexible substrate according to the embodiment of the present invention and the matrix substrate of the liquid crystal panel.

FIG. 4 is a partial enlarged cross-sectional view of the connection portion between the flexible substrate 20 and the matrix substrate 2, showing a section taken along a line X-X' in FIG. 3.

As shown in FIG. 4, the flexible substrate 20 and the matrix substrate 2 are connected with each other by an anisotropic conductive film 11 in which conductive particles 13 are contained in an adhesive resin base material 12. At this time, the conductive particles 13 are sandwiched between surfaces of the connection terminals 25 (25a, 25b) and surfaces of the electrode terminals 6, and are in contact with both of them, whereby electrical continuity is established. Therefore, the continuity between the connection terminal 25 and the electrode terminal 6 varies depending on the size of an area where the connection terminal 25 and the electrode terminal 6 are opposed to each other. As the opposed area between the electrodes increases, the electrical continuity can be obtained more reliably via the conductive particles 13 of the anisotropic conductive film 11.

In the connection portion between the flexible substrate 20 and the matrix substrate 2, the connection terminals 25 are made narrower than the corresponding electrode terminals 6 for the purpose of obtaining a margin for the alignment of the connection terminals 25 and the electrode terminals 6. Therefore, an opposed portion between the connection terminal 25a having the same width as the wiring pattern 22 and the electrode terminal 6 is limited to the width of the connection terminal 25a. In other words, on the surface of the electrode terminal 6, only the central portion that is opposed to the connection terminal 25a can establish the electrical continuity between the electrode terminal 6 and the connection terminal 25a. Meanwhile, portions of the electrode terminal 6 that are positioned at both outer sides except the central portion and that are not opposed to the connection terminal 25a cannot establish the electrical continuity.

On the contrary, in the case of the wide connection terminal 25b having the width extending across two neighboring lines, an opposed portion between the wide connection terminal 25b and the electrode terminal 6 is from the central portion of the electrode terminal 6 to one end portion thereof on the side where the wide connection terminal 25b is formed extendedly. Therefore, although the electrode terminals 6 have the same width, an area of the opposed portion between the wide connection terminal 25b and the electrode terminals 6 is larger than an area of the opposed portion between the connection terminal 25a having the same width as the wiring pattern 22 and the electrode terminal 6. Consequently, the number of the electrode terminals 6 to be connected is increased and the area of the opposed portion between the electrode terminal 6 and the connection terminal 25 is increased, whereby the continuity is established more reliably and the electrical connection between the wide connection terminals 25b and 25c and the electrode terminals 6 is performed with lower resistance.

Therefore, by adopting the wide connection terminals 25b and 25c as the connection terminals 25 of the flexible substrate 20 to be connected to the lead-out lines 4 via the electrode terminals 6, it is possible to reduce the resistance at the connection portion between the flexible substrate 20 and the matrix substrate 2, in addition to the reduction of resistance by forming a plurality of the electrode terminals 6 with respect to one lead-out line 4 on the matrix substrate 2.

Further, since the resistance at the connection portion between the flexible substrate 20 and the matrix substrate 2 is reduced by using the wide connection terminals 25b and 25c, as in the above-described embodiment, the wide connection terminals 25b and 25c are used for the connection with the electrode terminal 6 connected to the power supply line or the ground line on the matrix substrate 2. Thereby, it is possible to reduce display noise occurring in the high-speed transfer of image signals or the like.

Although the above-described embodiment describes the wide connection terminal 25b having the terminal width extending across two lines of the flexible substrate 20 and the wide connection terminal 25c having the terminal width extending across three lines, the terminal width of the wide connection terminal is not limited to these. When four or more electrode terminals 6 in common are formed with respect to one lead-out line 4 on the matrix substrate 2 to be connected, it is possible to form on the flexible substrate 20 a wide connection terminal having a width extending entirely across the plural electrode terminals 6, each having the same electrical potential.

Note here that, as the width of the wide connection terminal increases, the adhesion force by the anisotropic conductive film 11 for the physical connection between the flexible substrate 20 and the matrix substrate 2 may decrease. This is because, although, from the aspect of improving the physical connection strength between the flexible substrate 20 and the matrix substrate 2, the adhesive resin that is the base material 12 of the anisotropic conductive film 11 is necessary to be filled in spaces of the electrode terminals 6 and the connection terminals 25 formed on the respective substrates, such spaces between the terminals of the connection terminals cannot be secured when the wide connection terminals are formed. In this case, for example, it is preferable to set an upper limit of the terminal width of the wide connection terminal at four times the sum of the connection terminal having the same width as the wiring width and the terminal space, and to form a tentative inter-terminal portion in the wide connection terminal when the terminal width exceeds this value.

Next, the connection terminal of the flexible substrate having another shape is described.

Figure 5A:
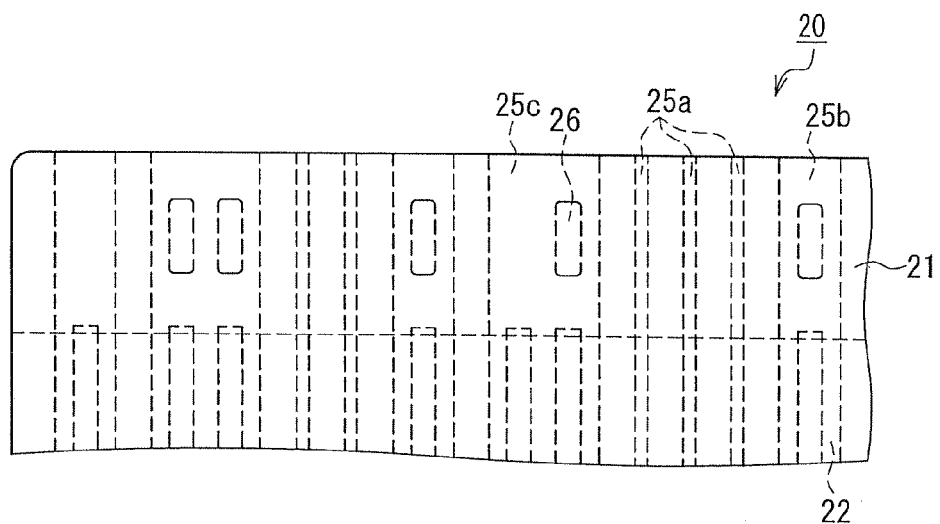
FIG. 5A is a partial enlarged plan view showing a configuration of the flexible substrate.
Figure 5B:
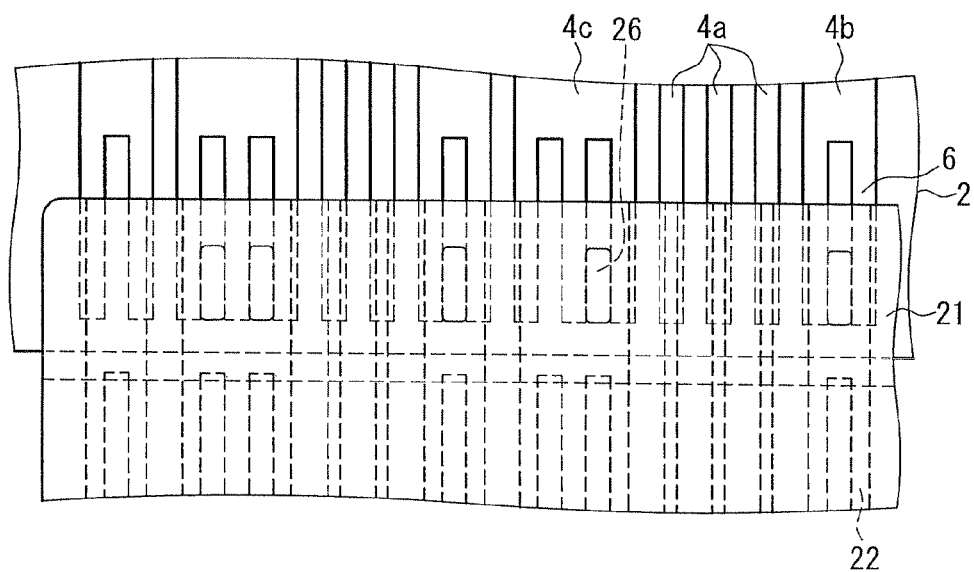
FIG. 5B is a partial enlarged plan view showing a connection portion between the flexible substrate and the matrix substrate of the liquid crystal panel.

FIG. 5A is a partial enlarged plan view showing the connection portion between the matrix substrate 2 and the flexible substrate 20 that has the connection terminal 25 in another shape. FIG. 5B shows a state in which the flexible substrate 20 and the matrix substrate 2 are connected with each other.

The connection terminals 25b and 25c of the flexible substrate 20 shown in FIGS. 5A and 5B have openings 26 at positions corresponding to between the lines of the wiring pattern 22 of the flexible substrate. Note here that the flexible substrate 20 shown in FIGS. 5A and 5B is identical to the flexible substrate 20 described with reference to FIGS. 2 and 3, except for the openings 26. Therefore, an explanation of the other parts is omitted.

As described with reference to FIG. 4, in the flexible substrate 20 according to the present embodiment, the resistance at the connection portion with the matrix substrate 2 can be reduced by the increased opposed area between the connection terminals 25 of the flexible substrate 20 and the electrode terminals 6 of the matrix substrate 2.

The position where the opening 26 is formed in the connection terminal of the flexible substrate corresponds to a region between the terminals of the electrode terminal 6 on the matrix substrate 2, to which the flexible substrate 20 is connected. Therefore, the opening 26 portion cannot contribute to the electrical continuity in the connection using the anisotropic conductive film 11.

In the portion where the opening 26 is formed, the base film 21 of the flexible substrate 20 and the matrix substrate 2 directly are opposed to each other without interposition of the connection terminal 25. In this portion, by filling both the flexible substrate 20 and the matrix substrate 2 with the adhesive resin that is the base material 12 of the anisotropic conductive film 11 used for the joint, it is possible to improve the physical joint force. Therefore, as in the example shown in FIG. 5, by providing the opening 26 of the connection terminal at the portion corresponding to the region between the lines of the wide connection terminals 25b and 25c, i.e., the portion not contributing to the reduction of the resistance at the electrical connection, it is possible to improve the physical adhesion strength between the flexible substrate 20 and the matrix substrate 2 without impairing the effect of the present invention of reducing the resistance at the electrical connection.

Note here that, as for the size of the opening 26, it is ideal that the opening 26 is formed entirely in a portion of the connection terminal 25 that does not overlap with the electrode terminal 6. However, considering the fact that a certain margin is required at the time of aligning and jointing the flexible substrate 20 and the matrix substrate 2, the size of the opening 26 preferably is about 10-50% with respect to an entire area of a portion of the connection terminal 25 that overlaps with a formation region of the electrode terminal on the matrix substrate 2.

Further, it is unnecessary to provide the openings 26 in all the portions of the wide connection terminals 25b and 25c of the flexible substrate 20 corresponding to the region between the terminals of the electrode terminals 6. As shown in FIGS. 5A and 5B, the wide connection terminal 25b provided with the opening 26 and the wide connection terminal not provided with the opening 26 may coexist. Further, in the wide connection terminal 25c extending across three electrode terminals 6, the opening 26 may be provided in either of two portions corresponding to the region between the terminals of the electrode terminals 6.

At this time, the opening 26 more preferably is formed in the wide connection terminal to be connected to the ground line than in the wide connection terminal to be connected to the power supply line. This is because, in many cases, a predetermined signal is applied to the power supply line, and the resistance value and the capacitance in the connection of the electrode terminal 6 and the connection terminal 25 may vary due to the formation of the opening 26. On the contrary, the ground line is free from adverse effects occurring due to such variations in the electrical characteristics.

Note here that, in FIGS. 5A and 5B, although the opening 26 has substantially a rectangular shape, the shape is not limited hereto. Further, the size and particularly the width of the opening 26 are unnecessary to perfectly coincide with the width of the region between the lines of the wiring pattern.

Figure 6:
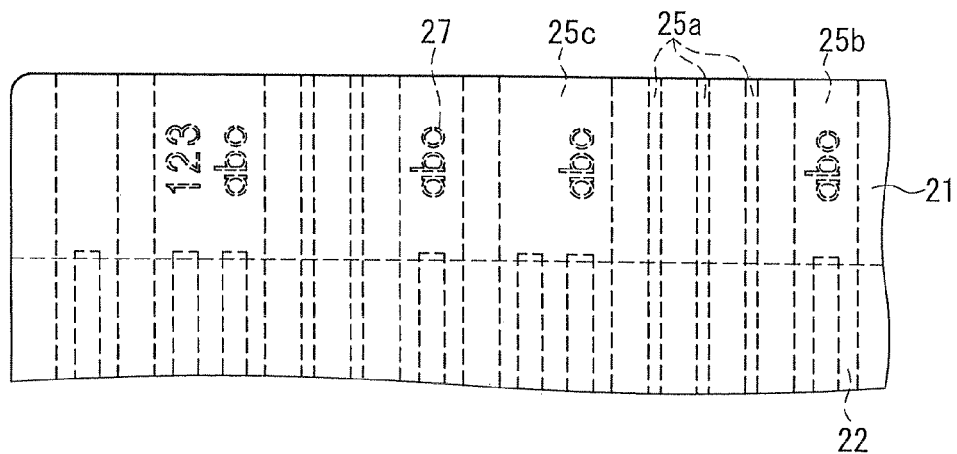
FIG. 6 is a partial enlarged plan view showing a configuration of another flexible substrate according to the embodiment of the present invention.

Next, FIG. 6 shows another specific example of the openings 26 formed in the connection terminals 25 in FIGS. 5A and 5B.

FIG. 6 is an enlarged plan view showing a portion of the flexible substrate 20 formed with the connection terminals 25. As shown in FIG. 6, in this another specific example, identification marks 27 such as characters are formed on the wide connection terminals 25b and 25c.

As described above, by providing the identification marks 27 on the wide connection terminals 25b and 25c, the openings 26 described in FIGS. 5A and 5B can be used as an information display. Note here that the identification mark in the present specification includes a wide range of concepts, from marks such as a product number or a corresponding specification number of the flexible substrate 20, a company name, and a logo for identifying the flexible substrate 20 or the electric circuit structure 100 having the flexible substrate 20 and the matrix substrate 2 connected with each other from other members, to marks such as a so-called alignment mark used during the alignment of the flexible substrate 20 and the matrix substrate 2 in the connection step for identifying the position and state of the flexible substrate.

Although the embodiment of the present invention only describes a case in which all the electrode terminals formed on the matrix substrate have the same predetermined width and the same pitch, the matrix substrate to which the flexible substrate of the present invention is connected is not limited hereto. Even if the width and the wiring pitch of the electrode terminal on the matrix substrate vary depending on the location, the present invention is applicable to such a matrix substrate without any problem.

Further, in the above description, a case is described in which the electric circuit structure of the present invention is a liquid crystal display device, the liquid crystal panel is a so-called active matrix type liquid crystal panel having a counter substrate and a matrix substrate, and the electric circuit board is the matrix substrate. However, the liquid crystal display device as the electric circuit structure of the present invention is not limited hereto, and a so-called simple matrix type liquid crystal panel may be adopted as the liquid crystal panel. Further, the driving method of the liquid crystal panel is not limited to a so-called vertically-aligned method in which a voltage is applied to between opposed substrates, and other driving methods such as an IPS method in which a voltage is applied to a plane direction of the substrate can also be adopted.

Further, in the case where the flexible substrates are connected to the two substrates constituting the liquid crystal panel, by setting these substrates as the electric circuit boards of the electric circuit structure according to the present invention and applying the present invention to the connection between the opposed two substrates and the flexible substrates, it is possible to provide the effect of reducing the resistance at the connection portion.

INDUSTRIAL APPLICABILITY

The present invention is industrially applicable as a flexible substrate to be connected to an electric circuit board by an anisotropic conductive film and as an electric circuit structure having the flexible substrate and an electric circuit board to which the flexible substrate is connected.

The invention claimed is:

1. A display device, comprising:
a flexible substrate; and
an electric circuit board that is connected electrically with the flexible substrate, wherein
the flexible substrate is made of a flexible base film, and includes wiring patterns and connection terminals that are formed at end portions of the wiring patterns,
the electric circuit board includes metal lines, lead-out lines that are led out from the metal lines, and electrode terminals that are formed at tips of the lead-out lines,
the connection terminals are connected electrically with the electrode terminals of the electric circuit board,
the electrode terminals include a first electrode terminal that is connected with one of the lead-out lines, and a plurality of second electrode terminals that are branched from one of the lead-out lines,
the connection terminals include a first connection terminal that is connected with one of the wiring patterns, and a second connection terminal that is joined from a plurality of the wiring patterns, and
the second connection terminal and a plurality of the second electrode terminals are opposed to each other on the electric circuit board in a thickness direction of the electric circuit board, wherein
the width of the second connection terminal is narrower than the width of the lead-out line that is connected with the second electrode terminals to be connected with the second connection terminal, and
the number of wiring patterns of the second connection terminal coincides with the number of branches of the second electrode terminal.

2. The display device according to claim 1, wherein
the second connection terminal has an opening at a position corresponding to between lines of the wiring pattern.

3. The display device according to claim 2, wherein
the opening is an identification mark.

4. The display device according to claim 1, wherein
the flexible substrate and the electric circuit board are connected with each other by an anisotropic conductive film.

5. The display device according to claim 4, wherein
the display device is a liquid crystal display device, and
the electric circuit board is at least one of a pair of substrates opposed to each other with a liquid crystal layer interposed therebetween in the liquid crystal display device.

6. The display device according to claim 1, wherein
the first connection terminal has the same width as the wiring pattern.

7. The display device according to claim 1, wherein the second connection terminal is wider than the first connection terminal.

8. The display device according to claim 6, wherein
the terminal width of the second connection terminal is four times or less the sum of the width of the first connection terminal and the width of a space of the first connection terminal.

* * * * *